(12) United States Patent
Beer

(10) Patent No.: US 6,285,621 B1
(45) Date of Patent: Sep. 4, 2001

(54) METHOD OF MINIMIZING THE ACCESS TIME IN SEMICONDUCTOR MEMORIES

(75) Inventor: Leopold Beer, Sindelfinger (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/373,476

(22) Filed: Aug. 12, 1999

Related U.S. Application Data

(63) Continuation of application No. PCT/DE98/00290, filed on Feb. 2, 1998.

(30) Foreign Application Priority Data

Feb. 12, 1997 (DE) .............................................. 197 05 355

(51) Int. Cl.$^7$ .................................................. G11C 7/00
(52) U.S. Cl. .......................................................... 365/226
(58) Field of Search ........................ 365/185.09, 185.18, 365/185.21, 185.23, 185.24, 200, 201, 226, 230.03

(56) References Cited

U.S. PATENT DOCUMENTS

| | | | |
|---|---|---|---|
| 4,631,724 | 12/1986 | Shimizu | 365/201 |
| 5,276,648 | * 1/1994 | Yanagisawa et al. | 365/201 |
| 5,440,520 | 8/1995 | Schutz et al. | 365/226 |
| 5,801,988 | * 9/1998 | Pascucci | 365/185.21 |
| 5,999,480 | * 12/1999 | Ong et al. | 365/230.03 |
| 6,005,806 | * 12/1999 | Madurawe et al. | 365/185.23 |

FOREIGN PATENT DOCUMENTS

0602355A1    6/1994    (EP).

OTHER PUBLICATIONS

"Back–bias testing in DRAMs", Praveen Gupta, 8029 Electronic Engineering, Nov. 1985, No. 707, London, Great Britain, pp. 185–193.

Proceedings of the 1$^{st}$ European Test Conference, Paris, Apr. 12–14, 1989, IEEE Computer Society Order No. 1937, pp. 276–283.

"Fast Programmable 256K Read Only Memory with On–Chip Test Circuits", Shigeru Atsumi et al., 8093 IEEE Transactions on Electron Devices, Feb. 1985, No. 2, New York, pp. 503–507.

IBM Technical Disclosure Bulletin, vol. 28, No. 9, Feb. 1986, pp. 3961–3962.

* cited by examiner

Primary Examiner—Trong Phan
(74) Attorney, Agent, or Firm—Herbert L. Lerner; Laurence A. Greenberg; Werner H. Stemer

(57) ABSTRACT

The dictates of production mean that the access times of semiconductor memories are subject to fluctuations, even given identical technological parameters. The fluctuations lead to a proportion of slow memory chips. The access time is shortened by raising the internal supply voltage of the slower semiconductor memories by an absolute value which is dependent on the respective semiconductor memory. The method is employed in semiconductor memories, in particular in dynamic semiconductor memories.

17 Claims, 1 Drawing Sheet

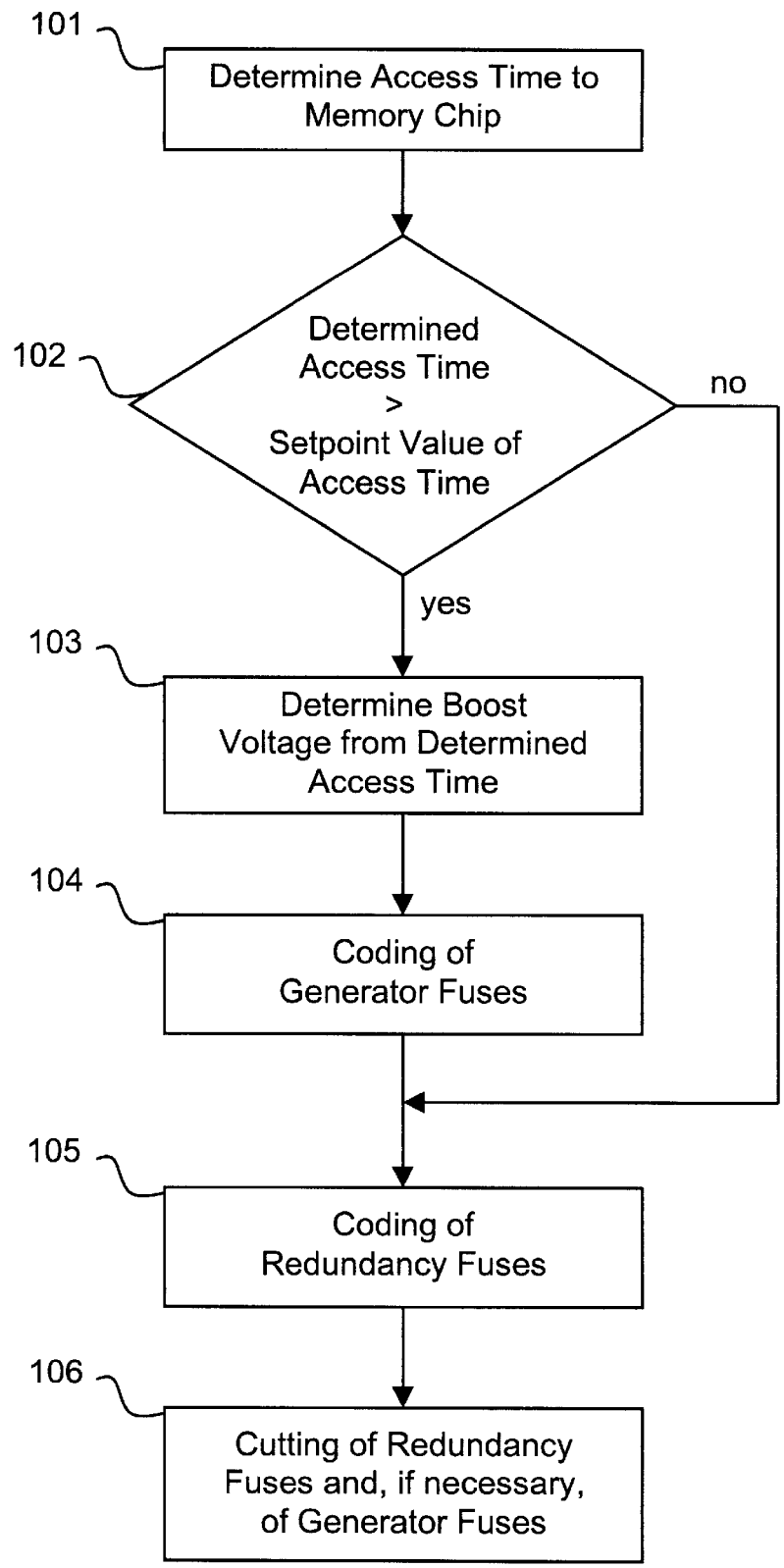

METHOD OF MINIMIZING THE ACCESS TIME IN SEMICONDUCTOR MEMORIES

CROSS REFERENCE TO RELATED APPLICATION

This is a continuation of copending international application PCT/DE98/00290, filed Feb. 2, 1998, which designated the United States.

BACKGROUND OF THE INVENTION

Field of the Invention

The invention lies in the field of semiconductor technology. Specifically, the invention deals with minimizing the access time in semiconductor memory devices.

Semiconductor memories such as, for instance, dynamic semiconductor memories (DRAMs) are fabricated from semiconductor wafers. One wafer contains a multiplicity of identical memory chips. The dictates of production mean that the electrical parameters of these individual chips vary.

An important criterion for the power assessment and the selection of dynamic semiconductor memories among the electrical parameters is the access time. The access time is the time which elapses during a reading operation after the application of the address until the data read out are valid at the output. It is determined by the design and by a multiplicity of technological parameters (poly2 etching dimension, gateoxide, spacer TEOS, . . . )

On account of tolerances of the technological parameters and the dictates of production, the access times vary both among memory chips of an individual wafer and for memory chips of different wafers of a fabrication series. In a random selection of memory chips, the access times have a normal distribution. The proportion of memory chips whose access time lies above a specific limit can only be sold at a lower price than the faster memory chips, that is to say the memory chips which have a shorter access time.

If the technological parameters are chosen such that the proportion of fast chips increases, then the proportion of defective memory chips also increases, for example as a consequence of the punch-through effect in transistors or other production-dictated faults.

In this context, European patent application EP 0 602 355 A1 discloses a voltage generator for memories and circuits which is programmable by means of fuses. An internal voltage is increased to a desired voltage in steps using a counter and permanently set by blowing the fuses.

The relationship between the supply voltage and the access time of a semiconductor memory is disclosed in Atsumi et al., "Fast Programmable 256K Read Only Memory with On-Chip Test Circuits," in: IEEE Transactions on Electron Devices (ED 32,2/1985, No. 2, New York, USA)

SUMMARY OF THE INVENTION

It is accordingly an object of the invention to minimize the access time of semiconductor memories, which overcomes the above-mentioned disadvantages of the heretofore-known devices and methods of this general type and to specifically minimize the access time for those semiconductor devices which, on account of technological parameter fluctuations, have a longer access time than the access time which can be achieved for the technological parameters chosen.

With the foregoing and other objects in view there is provided, in accordance with the invention, a method of minimizing access time to data of a semiconductor memory by means of a supply voltage generator for generating an internal supply voltage, which comprises the following method steps:

defining a standby current of a semiconductor memory as a parameter characterizing an access time to the semiconductor memory;

assigning a value of a boost voltage to the value of the parameter, whereby a magnitude of the boost voltage is greater than the given value of an internal supply voltage of the semiconductor memory and at which boost voltage the semiconductor memory is still functional; and setting the internal supply voltage to the value of the boost voltage.

With the above and other objects in view there is also provided, in accordance with the invention, a related method which comprises the following method steps:

defining a threshold voltage of a field-effect transistor on a semiconductor memory as a parameter characterizing an access time to the semiconductor memory;

assigning a value of a boost voltage to the value of the parameter, whereby a magnitude of the boost voltage is greater than the given value of an internal supply voltage of the semiconductor memory and at which boost voltage the semiconductor memory is still functional; and setting the internal supply voltage to the value of the boost voltage.

The invention has the advantage that the yield of comparatively fast memory chips is increased, when all the memory chips on a wafer are measured in their entirety and all the memory chips of a fabrication series are measured in their entirety in comparison with memories in which the method according to the invention is not used. The application of the method does not impair the yield of functional memory chips. A further advantage of the method according to the invention is that production fluctuations which affect the access time can be compensated for after production. Moreover, the technological parameters, in particular the poly2 line width, can be dimensioned such that they lie within a reliable range in which technology-related failures are avoided.

In accordance with an added feature of the invention, the value of the access time characterizing parameter is determined after applying an external supply voltage to the semiconductor memory, as soon as the semiconductor memory has reached a state of functional readiness.

In accordance with an additional feature of the invention, the value of the access time characterizing parameter is determined during a functional test of the semiconductor memory.

In accordance with another feature of the invention, the assigning step comprises assigning the value of the boost voltage to the value of the parameter by means of experimentally determined measurement curves.

In accordance with a further feature of the invention, the setting step comprises setting the internal supply voltage to the value of the boost voltage by blowing at least one fuse of the supply voltage generator of the semiconductor memory.

In a preferred embodiment, the blowing of fuse is effected temporally in parallel with a blowing of any other fuses of the semiconductor memory.

In accordance with again an added feature of the invention, the setting step comprises controlling the supply voltage generator by means of a control circuit, whereby the threshold voltage of the field-effect transistor is transferred to the control circuit.

In accordance with a concomitant feature of the invention, the setting step comprises setting the internal supply voltage to the value of the boost voltage in steps. The preferred step of the increase is thereby 0.3 V.

Other features which are considered as characteristic for the invention are set forth in the appended claims.

Although the invention is illustrated and described herein as embodied in a method for minimizing the access time in semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a flow diagram illustrating an exemplary sequence of the method according to the invention.

DESCRIPTION OF THE PREFERRED EMBODIMENT

Given a predetermined design and technological parameters, the access time critically depends on the internal supply voltage at which the cell array of the semiconductor memory operates. This voltage may differ from an external supply voltage with which the external circuit situated outside the cell arrays is operated.

The present invention is based on the fact that a supply voltage generator on the memory chip provides the internal supply voltage. However, the method according to the invention can also readily be used if the internal supply voltage is accommodated by a supply voltage generator on a separate chip or is fed to the semiconductor memory externally in another way.

The internal supply voltage directly influences the access time. By increasing the internal supply voltage, the current yield and transconductance of the transistors of the memory cell array are increased. That leads to a faster switching behavior of the transistors and, consequently, to a shorter access time. The internal supply voltage is usually constant (for example 3.3 V). The method according to the invention provides for the internal supply voltage to be increased in the memory chips whose access time exceeds a predetermined threshold. The access time is reduced as a result of this.

In a first step 101 of the method, the value of a parameter which is an unambiguous measure of the access time of the semiconductor chip is determined. From the value of this parameter which characterizes the access time, the access time can be determined for example mathematically or with the aid of an existing measurement curve. The parameter may be, for example, the standby current, that is to say the supply current which flows in the case where the semiconductor memory is inactivated, if no access is made to the semiconductor memory. By way of example, the standby current can be measured in the course of a first test procedure that is implemented (pre die sort, pre-dicing test), when the individual semiconductor chips are still situated on the wafer.

It is preferable for the standby current to be determined during an initialization phase at a point in time after the application of the external supply voltage to the semiconductor memory at which the semiconductor memory has just reached its state of functional readiness.

The resulting difference between a desired value of the access time, the desired value being identical to the predetermined threshold of the access time or lying above the threshold, and the determined access time determines the absolute value of the voltage to which the internal supply voltage is subsequently raised. At this boost voltage, the access time is shorter than before. It is stipulated in each case depending on the value of the measured parameter which characterizes the access time, in such a way that it has the highest possible magnitude that the functionality of the semiconductor memory is preserved.

It is entirely within the invention to directly infer the possible boost voltage from the value of the measured characteristic parameter. For this purpose, use is made for example of measurement curves which are determined in test runs and reproduce the relationship between the determined value of the parameter which characterizes the access time and the maximum permissible internal supply voltage (=boost voltage).

It is well known to those of skill in the art of semiconductor memories that redundant memory cells provided for the replacement of defective memory cells are selected by blowing so-called redundancy fuses (cutting redundancy fuses). The setting of the voltage in supply voltage generators is frequently done in a similar manner using generator fuses. In a special embodiment of the method according to the invention, suitable generator fuses are blown depending on the boost voltage determined. This can be done temporally in parallel with the blowing of any redundancy fuses that are present.

In other words, in this embodiment, the internal supply voltage is increased in steps by the blowing of individual generator fuses. It is advantageous to provide for increasing in steps of 0.3 V. In this case, it is favorable if a total voltage change of more than 1 V can be achieved. However, other voltage steps and other voltage changes are also possible.

The blowing of the generator fuses is usually done by means of laser light or by using current pulses.

As an alternative, the threshold voltage of a field-effect transistor can also be provided as the parameter which characterizes the access time. If the transistor is likewise situated on the semiconductor memory, then it is subjected to the same fabrication fluctuations as the actual semiconductor memory. In other words, there is a direct relationship between the threshold voltage of the field-effect transistor and the access time of the semiconductor memory, which is used to set the internal supply voltage to the value of the boost voltage. For this purpose, the threshold voltage is transferred for example to a control circuit which directly controls the supply voltage generator.

The flow diagram in the FIGURE shows one embodiment of the method according to the invention in the course of a production sequence. The access time of the memory chips is determined, for example during a first functional test of the memory chips. Comparing the determined access time with the predetermined desired value in step 102 reveals the memory chips which are too slow and for which the internal supply voltage is consequently increased. Their boost voltage is determined proceeding from the determined access time in step 103. The spatial position on the wafer plane of each memory chip is determined by its coordinates. For each memory chip, the fact of whether a boost voltage, and if appropriate which boost voltage, results from the measured access time is recorded on a data carrier together with the position of the chip in step 104. These details are required for the blowing of the generator fuses and serve for coding the generator fuses. Afterwards, the redundancy fuses which are to be blown are additionally recorded on the data carrier for each semiconductor chip in step 105. This coding of the redundancy fuses may also be effected prior to the coding of the generator fuses.

The redundancy and generator fuses, which are correspondingly identified in the coding of the redundancy fuses and the coding of the generator fuses, are then blown in step 106.

It is advantageously done together in a single step. Step is then followed by the customary test methods for conductor chips.

I claim:

1. A method of minimizing access time to data of a semiconductor memory by means of a supply voltage generator for generating an internal supply voltage, which comprises the following method steps:

defining a standby current of a semiconductor memory as a parameter characterizing an access time to the semiconductor memory;

assigning a value of a boost voltage to the value of the parameter, whereby a magnitude of the boost voltage is greater than the given value of an internal supply voltage of the semiconductor memory and at which boost voltage the semiconductor memory is still functional; and setting the internal supply voltage to the value of the boost voltage.

2. The method according to claim 1, wherein the defining step comprises determining the value of the access time characterizing parameter after applying an external supply voltage to the semiconductor memory, as soon as the semiconductor memory has reached a state of functional readiness.

3. The method according to claim 1, wherein the defining step comprises determining the value of the access time characterizing parameter during a functional test of the semiconductor memory.

4. The method according to claim 1, wherein the assigning step comprises assigning the value of the boost voltage to the value of the parameter by means of experimentally determined measurement curves.

5. The method according to claim 1, wherein the setting step comprises setting the internal supply voltage to the value of the boost voltage by blowing at least one fuse of the supply voltage generator of the semiconductor memory.

6. The method according to claim 5, wherein the step of blowing the at least one fuse is effected temporally in parallel with a blowing of any other fuses of the semiconductor memory.

7. The method according to claim 1, wherein the setting step comprises setting the internal supply voltage to the value of the boost voltage in steps.

8. The method according to claim 7, wherein the setting step comprises increasing the internal supply voltage in steps of 0.3 V.

9. A method of minimizing an access time to data of a semiconductor memory by means of a supply voltage generator for generating an internal supply voltage, which comprises the following method steps:

defining a threshold voltage of a field-effect transistor on a semiconductor memory as a parameter characterizing an access time to the semiconductor memory;

assigning a value of a boost voltage to the value of the parameter, whereby a magnitude of the boost voltage is greater than the given value of an internal supply voltage of the semiconductor memory and at which boost voltage the semiconductor memory is still functional; and setting the internal supply voltage to the value of the boost voltage.

10. The method according to claim 9, wherein the defining step comprises determining the value of the access time characterizing parameter after applying an external supply voltage to the semiconductor memory, as soon as the semiconductor memory has reached a state of functional readiness.

11. The method according to claim 9, wherein the defining step comprises determining the value of the access time characterizing parameter during a functional test of the semiconductor memory.

12. The method according to claim 9, wherein the assigning step comprises assigning the value of the boost voltage to the value of the parameter by means of experimentally determined measurement curves.

13. The method according to claim 9, wherein the setting step comprises setting the internal supply voltage to the value of the boost voltage by blowing at least one fuse of the supply voltage generator of the semiconductor memory.

14. The method according to claim 13, wherein the step of blowing the at least one fuse is effected temporally in parallel with a blowing of any other fuses of the semiconductor memory.

15. The method according to claim 9, wherein the setting step comprises controlling the supply voltage generator by means of a control circuit, whereby the threshold voltage of the field-effect transistor is transferred to the control circuit.

16. The method according to claim 9, wherein the setting step comprises setting the internal supply voltage to the value of the boost voltage in steps.

17. The method according to claim 16, wherein the setting step comprises increasing the internal supply voltage in steps of 0.3 V.

* * * * *